United States Patent
Ustinov et al.

(10) Patent No.: US 8,491,972 B2
(45) Date of Patent: Jul. 23, 2013

(54) METHOD OF PRODUCING ENCAPSULATED NANOPOWDERS AND INSTALLATION FOR ITS REALIZATION

(75) Inventors: Anatoliy I. Ustinov, Kiev (UA); Tatyana V. Melnychenko, Kiev (UA); Kyra V. Lyapina, Kiev (UA); Vasiliy I. Chaplyuk, Kiev (UA)

(73) Assignee: E.O. Paton Electric Welding Institute of the National Academy of Sciences of Ukraine, Kiev (UA)

( * ) Notice: Subject to any disclaimer, the term of this patent is extended or adjusted under 35 U.S.C. 154(b) by 717 days.

(21) Appl. No.: 12/035,468

(22) Filed: Feb. 22, 2008

(65) Prior Publication Data

US 2008/0268178 A1 Oct. 30, 2008

(30) Foreign Application Priority Data

Feb. 26, 2007 (UA) .................................. 200702007

(51) Int. Cl.
*C23C 14/24* (2006.01)
*B22F 9/12* (2006.01)

(52) U.S. Cl.
USPC ........... 427/596; 427/457; 427/508; 427/553; 427/554; 427/509; 427/595; 427/597; 118/715; 118/726; 118/727; 118/716; 118/620; 118/723 EB; 118/723 VE

(58) Field of Classification Search
USPC ........................................................ 427/596
See application file for complete search history.

(56) References Cited

U.S. PATENT DOCUMENTS

2005/0061108 A1* 3/2005 El-Shall et al. .................. 75/345
2007/0178163 A1* 8/2007 Kodas et al. ................... 424/489

FOREIGN PATENT DOCUMENTS

WO   WO 95/32061   * 11/1995

OTHER PUBLICATIONS

Arrieta et al., "Synthesis and characterization of sodium chloride thin films obtained by pulsed laser deposition", Applied Physics A, (Dec. 1999).*
Movchan, "EB-PVD Technology in the Gas Turbine Industry: Present and Future", JOM, Nov. 1996.*

* cited by examiner

*Primary Examiner* — Nathan Empie
*Assistant Examiner* — Lisha Jiang
(74) *Attorney, Agent, or Firm* — Cesari and McKenna, LLP

(57) ABSTRACT

Method and equipment to produce nanopowders of materials based on pure metals, their alloys and chemical compounds of these metals with elements taken from the row of B, C, O and Si, encapsulated into a salt shell selected from the group of NaCl, NaF, LiCl, and LiF or their mixtures, includes independent evaporation by means of electron beam and/or laser radiation sources of the material and alkali metal(s) halogenide and simultaneous deposition of a mixture of their vapor phases on a substrate in a closed pumped-down volume. To achieve the required ratio of vapor flows, a screen with variable cross-section diaphragms is placed between the substrate movable in parallel to the evaporators, and the evaporators, thus allowing an independent regulation of the intensity of the vapor flow coming to the substrate from each of the evaporators.

5 Claims, 10 Drawing Sheets

METHOD OF PRODUCING ENCAPSULATED NANOPOWDERS AND INSTALLATION FOR ITS REALIZATION

BACKGROUND OF THE INVENTION

1. Field of the Invention

This invention related to a method of producing by vacuum evaporation nanodimensional powders with particles enclosed in a sheath which protects them from the environment.

More specifically, this invention relates to a single-stage method of manufacture of encapsulated nanopowders of metals taken from the group consisting of Be, Mg, Al, Ca, Sc, V, Cr, Zn, Fe, Ni, Cu, Ti, Si, Co, Pt, Au, Zr, Mn, Sr, Y, Nb, Mo, Ag, Ba, La, Hf, Ta, W, Pt, Au, Bi, Ce, Sm and Dy or alloys on their base and chemical compounds of these metals with elements taken from the group consisting of B, C, O, Si (hereinafter referred to as "material"), encapsulated into a sheath of salt taken from the group consisting of NaCl, NaF, KCl, KF, LiCl and LiF and their mixtures (hereinafter referred to as "salt") using evaporation of material and salt in a closed volume and combined condensation of their vapor phases on a metal substrate.

2. The Prior Art

It is known that powdered materials change greatly as to their functional properties, such as melting temperature, heat of evaporation, ionization energy, work function of electrons, magnetic properties, etc., when sizes of separate particles reach a nanodimensional scale (sizes of particles become less than 100 nm) [A. I. Gusev, A. A. Rempel, Nanocrystalline materials, Moscow, Phizmatgiz, 2001; R. A. Andrievsky, A. M. Gleser, Physika metallov i metallovedeniye, 1999, v. 88, No. 1, p. 50-73]. Owing to specific properties of nanopowders, and also to the nanodimensional scale of separate particles, the nanopowder materials find a wide application as functional materials with special magnetic and catalytic properties, energy activators of sintering processes and fillers for lubricating materials. In addition, the application of nanopowders opens up wide opportunities in the field of development of new materials and technologies and radically new instruments and devices. Thus, the nanopowders have found wide use as initial raw material in the production of nanocomposite materials, superconductors, solar batteries, filters, getters, components of low-temperature high-strength solders and other materials, whose high service properties are attained due to decrease in grain size.

Taking the above into account, the technology of manufacture of nanopowder materials is key technology for the solution of a wide range of problems. Moreover, it should provide their high resistance, despite the structural and chemical homogeneity of such powders, to their agglomeration and interaction with the atmosphere. One of the ways to achieve this aim is the encapsulation of the nanopowder particles.

The main methods of producing a nanopowder are the method of a gas phase and the method of a liquid phase [M. T. Swihart, Current Opinion in Colloid and Interface Science, v. 8, (2003), p. 127-133]. In case of a method of a gas phase, the nanopowders are produced by evaporation-condensation under conditions of a rapid cooling, while in the application of the liquid-phase method, the synthesis, for example, of metal nanopowders occurs with the use of organic solvents and polymers.

When producing nanopowders with participation of a gas phase, the material evaporation is realized by different methods; i.e., in a plasma jet, heating by electric current, laser or electron beam and others. However, these methods do not provide the necessary conditions for prevention of change in chemical composition of powders, for example, oxidation of the surfaces of particles of a metal powder and their agglomeration with time. Moreover, an explosion is possible at a definite concentration of powder particles in the atmosphere. Taking into account the pyrophoric nature of powders and their high energy saturation, the obligatory condition in the use of such methods is the encapsulation of particles of a nanopowder into a protective sheath which prevents their agglomeration and interaction with the environment (atmosphere) or conductance of synthesis of nanoparticles in the medium in which the synthesized particles are preserved. In known methods with participation of a liquid phase, the polymers, organic and inorganic salts are used to prevent the agglomeration of particles.

Thus, in patent No. WO2004/078641 of Sep. 16, 2004, Cl. IPC B82B3/00; B82B3/00; (IPCl-7); B82B3/00 (KANG DAE SAM), a liquid phase method is described for producing a metal nanopowder, encapsulated into a silicon oxide. The process consists in a combined disposition of metal ions, located in solution, and particles of silicon oxide, produced as a result of hydrolysis of an appropriate solution, on the electrode surface. Taking into account the high chemical resistance of the silicon oxide, the drawback of this method is the difficulty in the particles' release from the sheaths, into which they are encapsulated, for further use. In U.S. Pat. No. 5,593, 740 of Jan. 14, 1997, Cl. IPC B22F9/12; C23C14/00; C23C14/32; C23C16/26; H05H1/24; B22F9/02; C23C14/00' C23C14/32; C23C16/26; H05H1/23; (IPCl-7); H05H1/24 (STRUMBAN EMIL E., et al.), a method of synthesis of carbon-encapsulated metal nanopowder, produced by evaporation in a plasma jet, is suggested. The process consists of the following stages: metal is evaporated in arc melting and mixed with a gas, which contains carbon. The produced mixture is cooled at high rate. This results in the formation of metal nanoparticles in a sheath, containing a carbon.

The drawback of this proposed method of producing encapsulated nanoparticles is the difficulty in separation of nanoparticles from the sheaths covering them, which are formed on the base of inorganic elements of a high inertia as regards to the known solvents.

The method of producing a nanopowder, encapsulated in a salt matrix, which ensures its resistance to oxidation and is most close by combination of essential features to the present invention and selected as a prototype, is that described in patent No. WO9532061 of Nov. 30, 1995, Cl. IPC B01J2/00; B22/F1/02; B22F9/28; C01B113/22; C0135/04, C01G23/07; C23C16/30; C23C16/453; C23C16/56; B01J2/00; B22F1/02; B22F9/16; C01B13/20; C01B35/00; C01G23/00; C23C16/30; C23C16/453; C23C16/56; (IPCl-7): B05D7/00; C23C16/00; F23J7/00 (AXELBAUM RICHARD L. et al.). According to the description of the invention there, the nanopowder, whose encapsulated particles represent metals or intermetallic compounds, was produced by evaporation of metal and salt components in a closed volume, mixing of vapor phases of the pre-set components and their subsequent condensation. The closed volume of the reactor was filled preliminarily with argon, the evaporation of metal and salt components occurred in a gas flame with their subsequent condensation in the reactor atmosphere in the presence of a high degree of vapor oversaturation in the reactor atmosphere. As a result of this, the metal particles, encapsulated in a salt (sodium chloride), are formed. It follows from the invention description there that the salt matrix limits the agglomeration of nanoparticles and prevents their oxidation during their removal from the reactor into atmosphere. Nevertheless, this method does not allow producing nanopowders with a high degree of chemical purity, as the process of formation of powder particles occurs in the medium, saturated with gases and combustion products. Moreover, taking into account that the process of a particle's origin and its growth can occur in the reactor regions with a different degree of saturation with vapors, temperature, etc., this method makes it impossible to control the sizes of particles and to provide the formation of a nanopowder with a small dispersion of distribution of particles by size.

SUMMARY OF THE INVENTION

The present invention is based on the task to develop a method of manufacture of powders of metals, alloys or compounds of metals with non-metals (B, C, O, Si), i.e., materials, encapsulated into an inert sheath, which guarantees them protection from oxidation in the atmosphere and their easy removal by sheath dissolution. The method, which, due to a preset medium, provides feasibility to produce material particles of a nanoscale size, having no impurities, formed by metal interaction with gases (oxides, nitrides, etc.) and having a small dispersion of their distribution by size.

The stated problem has been solved in that a method is proposed for manufacture of nanopowders of materials, encapsulated into a sheath of salt, which includes the mixing, in a closed (pressurized) volume, of vapor phase components, which form a composite structure composed of the material particles, embedded in a salt matrix, and in which, according to invention, the mixing of vapor phase components is performed in a vacuum medium with the simultaneous evaporation of these materials and halogenide of an alkali metal and combined condensation of vapor phases on a substrate surface.

This solution provides the encapsulation of the material particles in a salt matrix under the conditions of vacuum, that eliminates the change in chemical composition of the material, which occurs during chemical interaction of atoms, included into the material composition, with gases, available in the chamber atmosphere. Taking into account the interaction of metal atoms, included into the material composition, and atoms, which form a salt, it is rational, according to the invention, to use such materials as a said material, whose composition includes the metal taken from the group consisting of Be, Mg, Al, Ca, Sc, V, Cr, Zn, Fe, Ni, Cu, Ti, Si, Co, Pt, Au, Zr, Mn, Sr, Y, Nb, Mo, Ag, Ba, La, Hf, Ta, W, Pt, Au, Bi, Ce, Sm and Dy, and to use the halogenide of an alkali metal as a salt, taken from the group consisting of NaCl, NaF, LiCl and LiF or their mixture.

Moreover, in accordance with the present invention, the process of a combined condensation of the material of nanoparticles and salt is rational under the conditions which provide the mixing of vapor flows of salt and material in ratio, at which the condensate with a volume fraction of salt of not less than 30% is formed.

According to the present invention, to evaporate components which form the encapsulated powders, it is rational to use the high-power beams of electrons and light, which will be spread in vacuum at minimum energy losses and defocusing. These schemes of evaporation can be realized in practice using electron beam guns and/or a laser source. Our method of a combined condensation of salt and material, where the ratio of their vapor flows guarantees the formation of condensate with a volume fraction of salt of not less than 30%, allows producing a material powder, encapsulated in a salt matrix on the substrate which is resistant to agglomeration and interaction with the environment at a low dispersion of particle size.

To realize the process of a combined condensation of vapor phase components which form the encapsulated nanoparticles of the material in a salt matrix, equipment can be used which provides the combined evaporation in a vacuum chamber of the above-mentioned components and their condensation on the substrate at a required ratio. The prior art closest to this invention by combination of the important features is the installation (prototype) for the combined electron beam evaporation and deposition of materials from two sources described in article (B. A. Movchan "EBPVD Technology in the Gas Turbine Industry: Present and Future", JOM (1996) 11 p.p. 40-45). It is shown in the installation description there that the sources of evaporation in the form of copper crucibles, cooled by water, are arranged at a small distance in the lower part of the vacuum chamber, while the powerful sources of electron beam radiation are arranged on the lateral walls of the chamber. By focusing one source of an electron beam on one of the crucibles into which the first component is placed, and focusing the second source on the second crucible into which the second component is placed, the power of the electron beam source is increased to melt the components and to start their evaporation. The intensity of evaporation of each component is determined by the power of the source focused on the crucible into which the component is placed. The vapor flows, which are formed here, were mixed and deposited on a planar substrate. Depending on the distance from the substrate rotation axis, the ratio of vapor flows is changed. The drawback of this installation is the absence of technical means for control of a necessary ratio of vapor flows of components which are evaporated on the substrate.

The second task of the invention consists in the design of the installation for realization of our method. The stated problem was solved in that the substrate holder is arranged in a vacuum chamber equipped with high-power beam sources and water-cooled-crucibles. This holder is furnished with a mechanism for substrate movement in a plane parallel to the plane of surfaces of salt and material melts towards the side of one or another crucible, for example, by an arrangement of the holder on guides along which can move and a screen located between the substrate holder and crucibles, said screen having holes whose sizes can be varied by gates which can provide closing and opening of these holes.

The technical essence and principle of invention are explained by the examples of invention embodiments to be described with reference to attached drawings.

DETAILED DESCRIPTION OF ILLUSTRATED EMBODIMENTS

Figure 1:
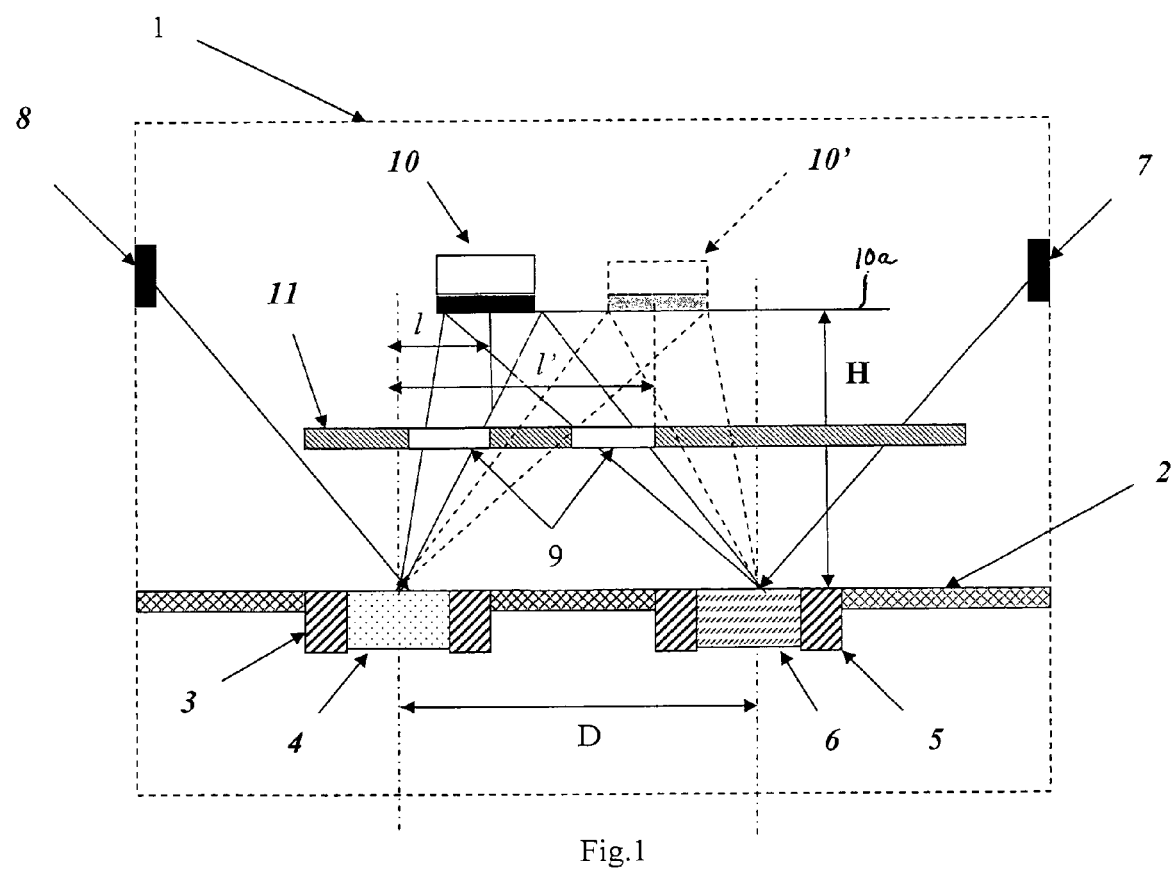
FIG. 1 is a schematic drawing showing the installation and process for the combined deposition from two sources of vapor phases of material and salt on a substrate.

In accordance with FIG. 1, a copper water-cooled crucible 3, into which a material ingot 4 is placed, on the base of which a powder is formed, and a crucible 5, into which an ingot 6 on the base of salts of alkali metals is placed, are mounted on a plate 2 in a vacuum chamber 1.

Figure 2:
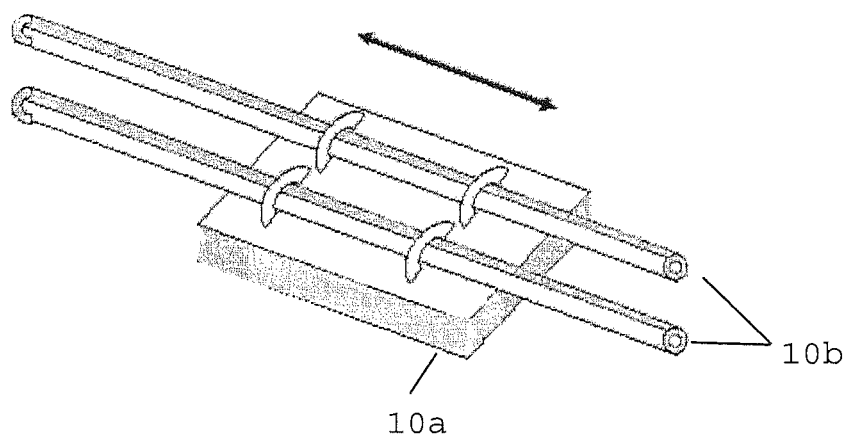
FIG. 2 is a diagrammatic view of a device for moving a substrate holder in a vacuum chamber along the guides in the FIG. 1 installation.
Figure 3:
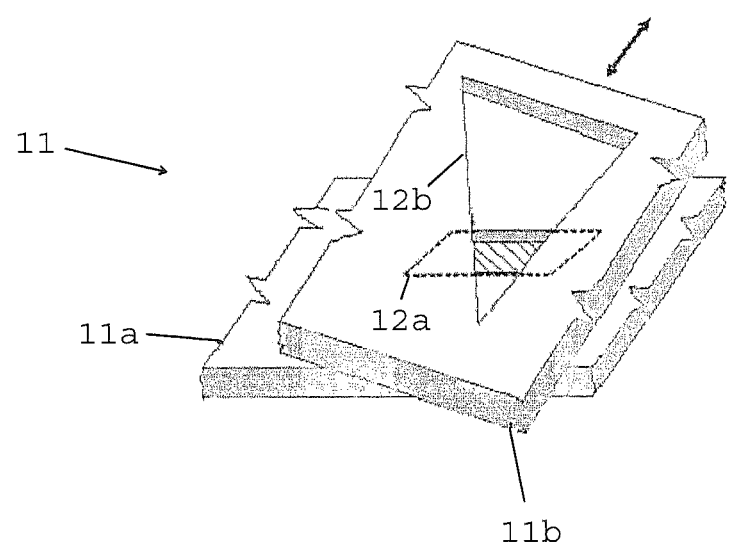
FIG. 3 is a schematic diagram of a protective screen used in the FIG. 1 installation.

In the upper part of the chamber 1, sources 7 and 8 of high-power beams (electron beam guns and/or a laser source) for evaporation are arranged. Between the crucibles 3, 5 and a substrate 10 fixed to a holder 10a which can move with respect to the crucibles along guides 10b (FIG. 2) extending along a line, parallel to an axis of the crucibles, a protective screen 11 is arranged with holes 9 whose sizes can change independently of each other as shown in FIG. 3. As seen there, screen 11 may comprise at least two superimposed perforate plates 11a and 11b which can move relative to one another. Plate 11a may have rectangular screen holes 12a, while plate 11b may have triangular gate holes 12b positioned opposite the screen holes. By moving the plates relatively in the direction of the arrow, the plate 11b may occlude none, part or all of the screen holes of plate 11a. Thus, in one setting the protective screen 11 may not allow penetration of vapor flows to the substrate 10, while in another working position, the screen opens the holes in plate 11a and enables the penetration of vapor flows to the substrate 10.

Using high-power beams sources 7 and 8, molten pools may be formed on the surfaces of ingots of material and salt in crucibles 3 and 5, respectively, that promote the evaporation of material (alloy) and salt uniformly over the entire surfaces of the ingots. Then, the holes 12a of a screen plate 11a may be opened to start the process of a combined condensation of vapor flows passing through the open holes 12a, onto the surface of substrate 10.

The design of the beam sources 7, 8 is similar to those described in the literature, and their power is defined by the required rate of evaporation.

This solution provides deposition of the material nanopowder on the substrate 10 without contamination of the nanopowder, which consists of nanoparticles with a small dispersity of size encapsulated into a salt matrix at a required ratio of components.

Initial data for calculation of the required ratio of vapor flows is the rate of evaporation of salt and material from the ingots. To determine the rate, it is necessary, first of all, to determine experimentally the dependence of rate of evaporation of salt and material on the value of power of the high-power beam sources.

The required ratio of vapor flows of salt and material (K) on the substrate 10, located at height H above the crucibles can be determined by the following expression:

$$K(l) = \frac{V_S \cos^n\{arctg[(D-l)/H]\}}{V_M \cos^n[arctg(l/H)]} \quad (1)$$

where $V_M$ is the rate of material ingot evaporation; $V_S$ is the rate of salt ingot evaporation; H is the distance from crucible to substrate 10; D is the distance between crucibles; l is the distance from an axis passed through the material ingot up to the middle of the substrate; n=2;3.

It is seen from Equation (1) that the value of the ratio of vapor flows, K(1), is affected not only by the relative rate of evaporation of salt to material, $V_S/V_M$, but also by the geometry of the substrate arrangement. At constant relative rate of salt to material, $(V_S/V_M)$, by displacement of substrate into the position 10' in FIG. 1 (due to change in the value 1 to 1') with respect to axial lines of the crucibles and constant distance between them (D), it is possible to change also the value of ratio of vapor flows of salt to material in accordance with Equation (1).

In addition, the required ratio of vapor flows of material and salt can be established by changing the sizes of the holes in the protective screen. To determine their optimum value, it is necessary to determine experimentally the dependence of the rates of evaporation of salt and material on value of screen holes at a constant value of the power of the source beams. Then, Equation (1) may be used to determine the size of the screen holes at a definite substrate position at which the required ratio of vapor flows of salt and material is provided.

Figure 4:
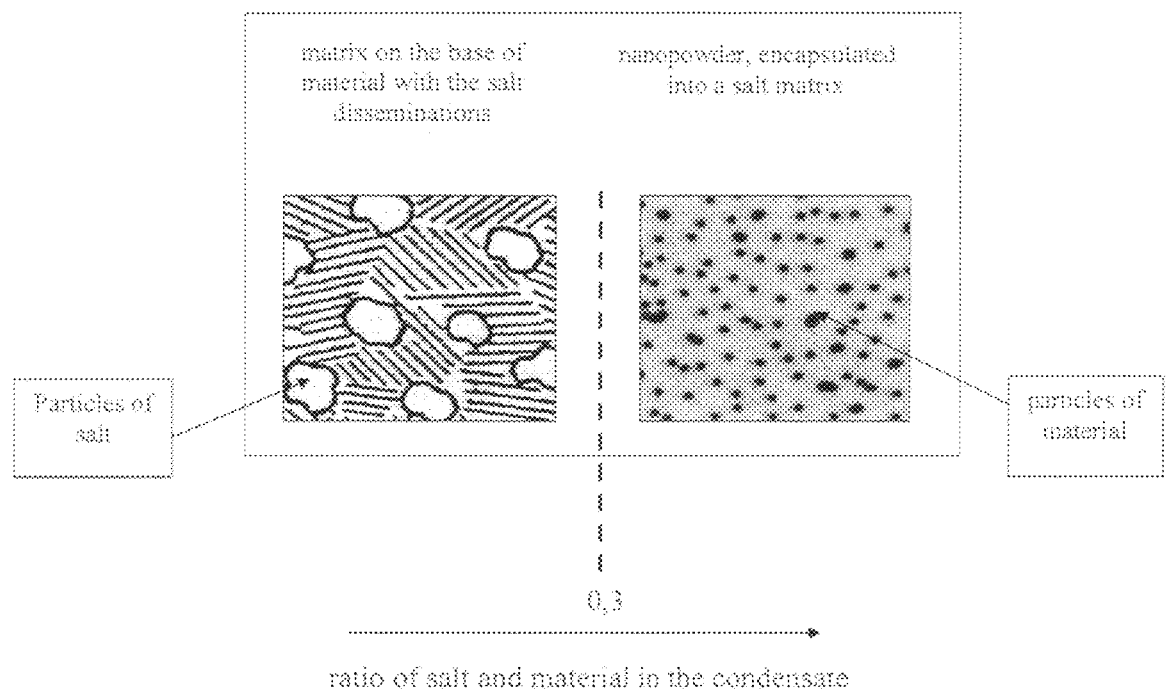
FIG. 4 is a diagrammatic view showing the formation of structure of condensates at different ratio of vapor flows of salt and material in the FIG. 1 installation.

The value of the required ratio of vapor flows of salt and material at which the material powders, encapsulated into a salt are formed, is determined coming from the structure of the condensate which is formed at a combined deposition of a vapor flow of salt and material. The structure of the condensate, which is formed at different ratios of vapor flows and material, can be divided conditionally into two structural zones. FIG. 4 represents a scheme of change in the condensate structure depending on the ratio of vapor flows of salt and material. It is seen that at a small ratio of vapor flows of salt and material (the first structural zone), the process of consolidation of material is dominating, i.e. a matrix is formed on the base of material, in which the salt disseminations are observed. When the ratio equal to 0.3 of their volume fractions and more, then the nanopowder, encapsulated into a salt matrix, is formed. This ratio of vapor flows of salt and material provides a reliable encapsulation of small nanoparticles, prevents their agglomeration and contamination with harmful impurities and contributes to the formation of spherical nanoparticles of the material.

The above-described invention can be understood better from the following examples.

Example 1

Formation of nickel nanopowder, whose nanoparticles are encapsulated into a matrix of salt of NaF, was made as follows:

Ingots of nickel and salt of NaF of 68 mm diameter were placed into water-cooled crucibles and subjected to electron beam evaporation with a subsequent condensation of vapor on a substrate according to FIG. 1. The substrate was fixed on a holder (FIG. 2), arranged along a line, located at equal distances from axial lines of ingots (symmetric arrangement).

Figure 5:
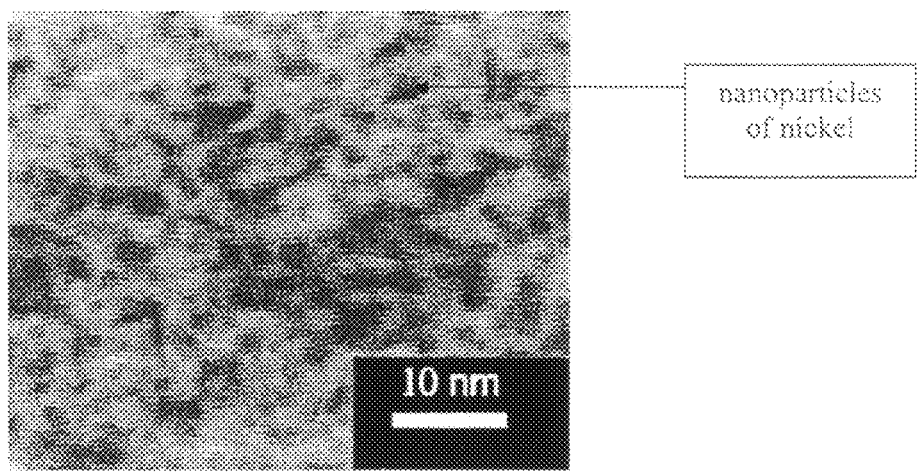
FIG. 5 shows the structure of metal nanoparticles of Ni, encapsulated into a salt matrix of NaF according to our process.
Figure 6:
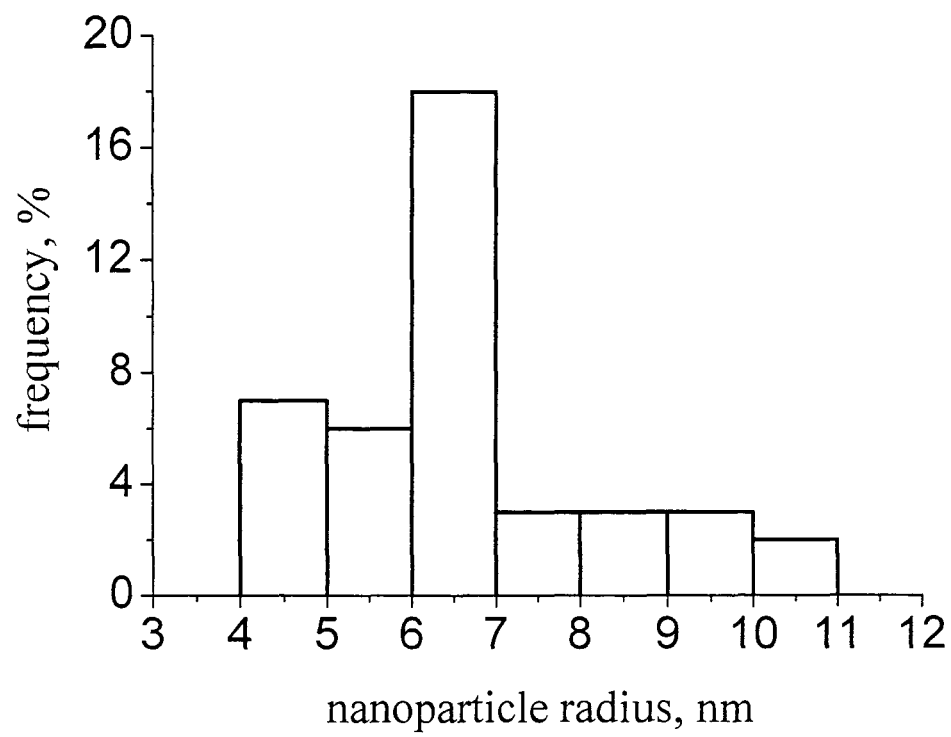
FIG. 6 shows the distribution of those metal nanoparticles by size.

After creation of pressure of residual gases at the level of $1 \times 10^{-4}$ Torr in the vacuum chamber 1, the ingots of nickel and salt were heated until appearance of molten pools on their surfaces. Ratios of vapor flows of salt and metal were controlled by providing the required power of electron beam guns, used to evaporation of salt and metal ingots. Then, the plate 11b of protective screen 11 was moved into a position which allowed the vapor flows of metal and salt to flow through screen 11 and encounter the substrate 10 on which they began to condense. Here the value of the current of the electron beam gun for salt evaporation was 0.2 A, while that for nickel evaporation 1.5 A at a difference of potentials of 18.7 kV at each gun. The vapor flows of salt and metal, which are formed simultaneously here, were mixed owing to the geometry of arrangement of crucibles and substrate and deposited jointly on a planar substrate located at the 300 mm height H from the crucibles 3, 5. At a selected condition of evaporation and arrangement of the substrate at 300 mm height from the plate 2 and at the 150 mm distance from the axis which passes through the metal ingot 4, the ratios of vapor flows of salt and metal along the substrate promotes the formation of a condensate with 30% fraction of salt. The condensate, formed on the substrate 10 as a result of this process, represents nanoparticles of nickel, close in shape to spherical ones, which are encapsulated into the matrix of sodium fluoride (FIG. 5). Distribution of small particles by size is shown in FIG. 6. Content of sodium fluoride in the produced powder is 30% of volume, that provides a delayed growth of nickel particles in the process of condensation and prevents their agglomeration.

Figure 7A:
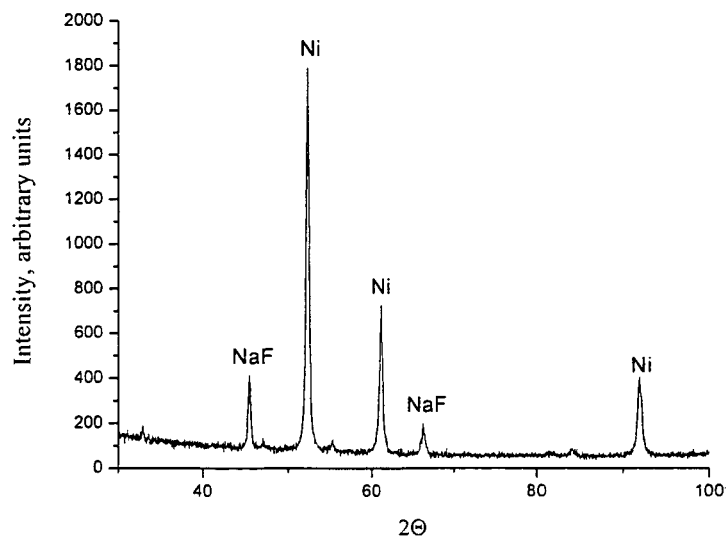
FIGS. 7a and 7b show diffractograms obtained from nanopowder of Ni, encapsulated into a salt matrix of NaF (a) and after washing in water (b)
Figure 7B:
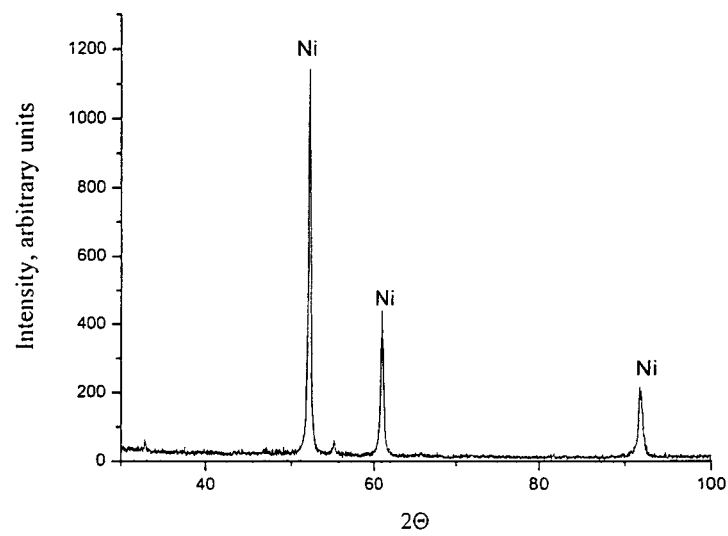

The produced encapsulated nanopowder was analyzed after several days holding in air using X-ray analysis. The appropriate diffractogram is shown in FIG. 7a. The diffractogram shows peaks only from Ni to NaF that confirms the effectiveness of a barrier effect of the sodium fluoride against oxidation of nickel nanoparticles. This is also proved by data which were obtained after separation of nanoparticles from the salt sheath by washing encapsulated powders in water. FIG. 7b shows the diffractogram of nickel powder, released from the sheath, where only peaks of nickel are present.

Example 2

Figure 8:
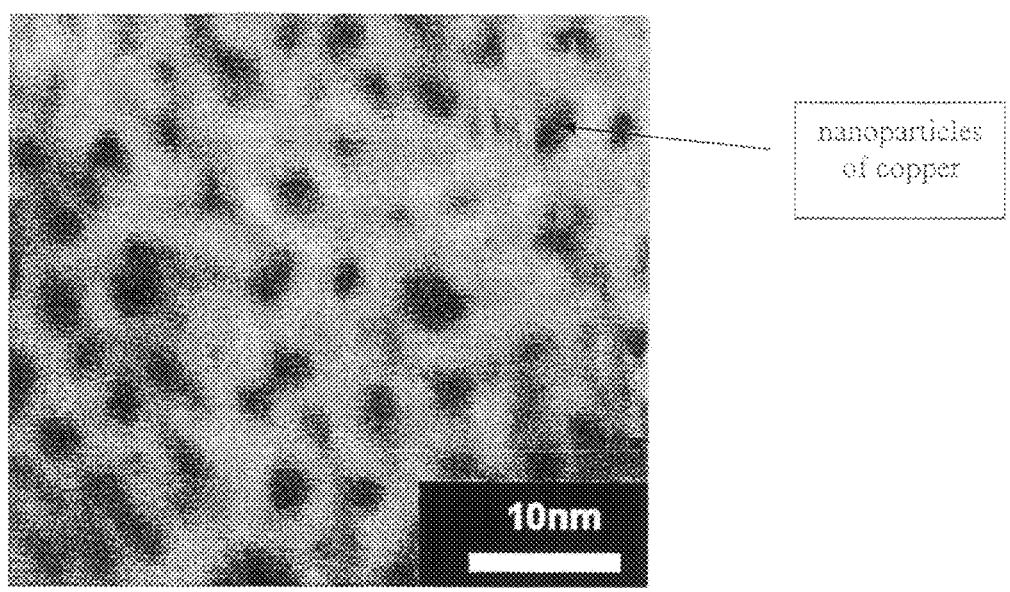
FIG. 8 shows the structure of metal nanoparticles of Cu, encapsulated into a salt matrix of NaCl according to our process.
Figure 9:
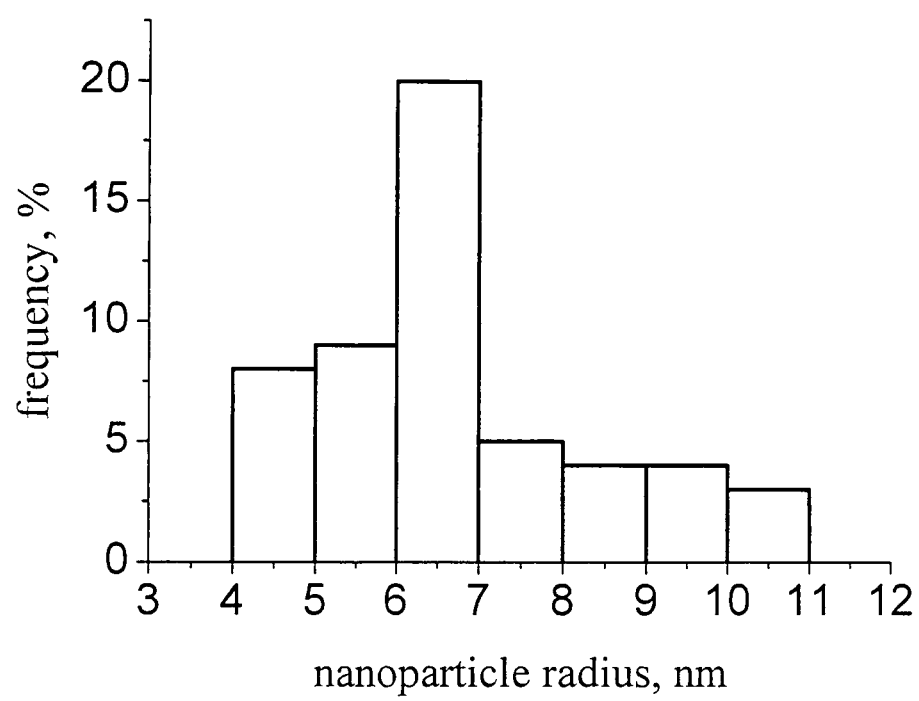
FIG. 9 shows the distribution of those metal nanoparticles of Cu by size.

Deposition of copper nanopowder, whose nanoparticles are encapsulated into a matrix of NaCl salt, was performed using the method similar to the one on the above-described Example 1, but different in that ingots of copper and sodium chloride were placed in water-cooled crucibles. An accelerating voltage at each electron beam gun was 18.7 kV, the values of their currents for substrate 10 heating, evaporation of salt and metal was 0.2 A, 0.1 A and 0.8 A, respectively. At a selected condition of evaporation and arrangement of the substrate at 300 mm height from the plate 2 and at 150 mm distance from the axis which passes through the metal ingot 4, the ratio of vapor flows of salt and metal was 0.3 of their volume fractions. The condensate formed on the substrate as a result of this process constituted nanoparticles of copper, close in shape to the spherical ones, encapsulated into a matrix of sodium chloride (FIG. 8). The distribution of particles by size was similar to that in Example 1 and is given in FIG. 9. The content of sodium chloride in the produced condensate was 30% volume fraction that guarantees a delayed growth of copper particles in the process of condensation and prevents the process of their agglomeration.

It should be noted that the salt matrix on the base of sodium chloride is also easily removed after washing the encapsulated nanopowder in water.

Example 3

Figure 10:
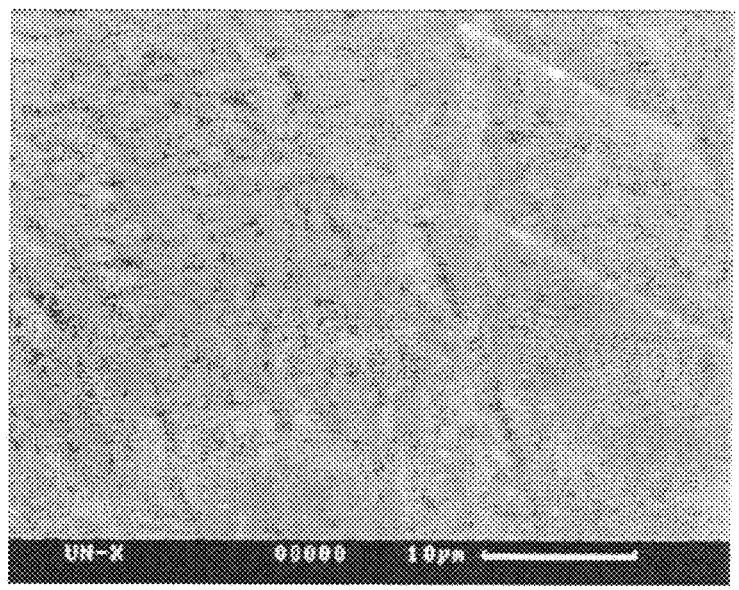
FIG. 10 shows the structure of copper condensate produced at a ratio of vapor flows of salt and metal at which the condensate is formed with 10% volume fraction of salt.

Deposition of copper vapors together with vapor of salt of NaCl was performed using method, similar to Example 2, but different in that the accelerating voltage at each electron beam gun was 18.7 kV, and values of current required for evaporation of salt and metal were 0.1 A and 1.5 A, respectively, that provided the ratio of vapor flows of salt and metal at which the condensate is formed with 10% volume fraction of salt at substrate 10 position at 300 mm height from the plate 2 and at 150 mm distance from the axis which passes through the metal ingot 4. As a result of this process, a condensate with a structure of a polycrystalline copper has formed on the substrate as shown in FIG. 10.

It will be appreciated from the foregoing that this invention will find wide application in industry for the production of nanopowder resistant to chemical interaction with the atmosphere and agglomeration and which is easily separated from its protective salt sheath in a medium which dissolves the salt sheath.

The invention claimed is:

1. A method of producing nanopowders of inorganic materials on a metallic basis, encapsulated into a sheath of salt comprising the steps of positioning a substrate having an exposed surface in a closed volume, placing separate crucibles containing ingots of, respectively, an inorganic material component and a salt component in said closed volume, heating the ingots using beam power of electron beams and/or laser beams causing melting and evaporation of said components on vacuum whereby vapor phase flows of the components mix and codeposit on said surface, and controlling the intensities of the vapor phase flows to said surface so that the on the surface has a selected minimum volume fraction of the salt component no less than 0.30, wherein controlling the intensities of the vapor phase flows is performed by one of moving of the substrate in a plane parallel to the melted components in said crucibles in a direction towards one or the other of the crucibles and arranging a screen with holes in a gap between said crucibles and the substrate so that the vapor phase flows through said holes wherein the size of said holes is controllably decreased or increased.

2. The method of claim 1, including the step of controlling the ratio of intensities of the vapor phase flows of said components by separately controlling the intensity of the vapor phase flow of each of said components.

3. The method of claim 1 or 2, including the step of controlling the intensity of the vapor phase flow of each of said components by separately controlling the power of the beam used for evaporation of said each component.

4. A method of producing nanopowders encapsulated into a sheath of salt comprising the steps of positioning a substrate having an exposed surface in a closed volume, placing separate crucibles containing ingots of, respectively, a material component and a salt component in said closed volume, preliminarily creating a vacuum in the closed volume, heating the ingots using beam power of electron beams and/or laser beams causing melting and evaporation of said components whereby vapor phase flows of the components mix and condense on said surface, and controlling the intensity of the vapor phase flow of each of said components by movement of the substrate in a plane parallel to the melted components in said crucibles in a direction towards one or the other of the crucibles.

5. A method of producing nanopowders encapsulated into a sheath of salt comprising the steps of positioning a substrate having an exposed surface in a closed volume, placing separate crucibles containing ingots of, respectively, a material component and a salt component in said closed volume, preliminarily creating a vacuum in the closed volume, heating the ingots using beam power of electron beams and/or laser beams causing melting and evaporation of said components whereby vapor phase flows of the components mix and condense on said surface, controlling the intensity of a vapor phase flow of each of said components by arranging a screen with holes in a gap between said crucibles and the substrate so that the vapor phase flows pass through said holes, and controllably decreasing or increasing the size of said holes.

* * * * *